US012062651B2

(12) United States Patent
Isobe et al.

(10) Patent No.: US 12,062,651 B2
(45) Date of Patent: Aug. 13, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yasuhiro Isobe, Ota Tokyo (JP); Hung Hung, Kawasaki Kanagawa (JP); Akira Yoshioka, Yokohama Kanagawa (JP); Toru Sugiyama, Musashino Tokyo (JP); Hitoshi Kobayashi, Yamato Kanagawa (JP); Tetsuya Ohno, Yokohama Kanagawa (JP); Masaaki Iwai, Yokohama Kanagawa (JP); Naonori Hosokawa, Yokohama Kanagawa (JP); Masaaki Onomura, Setagaya Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 331 days.

(21) Appl. No.: 17/468,252

(22) Filed: Sep. 7, 2021

(65) Prior Publication Data
US 2022/0077131 A1 Mar. 10, 2022

(30) Foreign Application Priority Data
Sep. 9, 2020 (JP) .................................. 2020-151229

(51) Int. Cl.
*H01L 25/18* (2023.01)
*H01L 25/07* (2006.01)
*H01L 25/16* (2023.01)
*H01L 29/778* (2006.01)
*H03K 17/687* (2006.01)
*H01L 23/00* (2006.01)

(52) U.S. Cl.
CPC ............ *H01L 25/18* (2013.01); *H01L 25/074* (2013.01); *H01L 25/16* (2013.01); *H01L 29/778* (2013.01);
(Continued)

(58) Field of Classification Search
CPC ....... H01L 25/18; H01L 25/074; H01L 25/16; H01L 29/778; H03K 17/6871
See application file for complete search history.

(56) References Cited

U.S. PATENT DOCUMENTS 8,987,833 B2 3/2015 McDonald et al.
9,041,186 B2 5/2015 Nomoto et al.
(Continued)

FOREIGN PATENT DOCUMENTS

JP 2008-198675 A 8/2008
JP 2009-289935 A 12/2009
(Continued)

*Primary Examiner* — Walter H Swanson
(74) *Attorney, Agent, or Firm* — Maier & Maier, PLLC

(57) ABSTRACT

A semiconductor device according to an embodiment includes: a first nitride semiconductor layer having a first surface and a second surface; a first source electrode provided on the first surface; a first drain electrode provided on the first surface; a first gate electrode provided on the first surface between the first source electrode and the first drain electrode; a second nitride semiconductor layer having a third surface and a fourth surface, the third surface being provided on the second surface and facing the second surface, and the second nitride semiconductor layer having a smaller band gap than the first nitride semiconductor layer; and a first semiconductor device having a fifth surface provided on the fourth surface and facing the fourth surface with a size equal to or smaller than a size of the fourth surface, the first semiconductor device including a first semiconductor material having a smaller band gap than the second nitride semiconductor layer.

16 Claims, 17 Drawing Sheets

(52) U.S. Cl.
CPC .......... *H03K 17/6871* (2013.01); *H01L 24/32* (2013.01); *H01L 24/33* (2013.01); *H01L 24/48* (2013.01); *H01L 24/49* (2013.01); *H01L 24/73* (2013.01); *H01L 2224/32145* (2013.01); *H01L 2224/33181* (2013.01); *H01L 2224/48227* (2013.01); *H01L 2224/49111* (2013.01); *H01L 2224/73265* (2013.01); *H01L 2924/10253* (2013.01); *H01L 2924/1033* (2013.01); *H01L 2924/10344* (2013.01); *H01L 2924/13064* (2013.01); *H01L 2924/13091* (2013.01)

(56) References Cited

U.S. PATENT DOCUMENTS

| | | |
|---|---|---|
| 9,654,004 B1 | 5/2017 | Deligianni et al. |
| 2008/0191216 A1* | 8/2008 | Machida ............ H01L 29/7786 257/E27.012 |
| 2011/0084341 A1 | 4/2011 | Kosaka |
| 2013/0240898 A1 | 9/2013 | Briere et al. |
| 2013/0299845 A1 | 11/2013 | Nomoto et al. |
| 2014/0367744 A1 | 12/2014 | Briere |
| 2017/0365533 A1* | 12/2017 | Cho ...................... H01L 29/778 |
| 2018/0013415 A1 | 1/2018 | Ikeda et al. |

FOREIGN PATENT DOCUMENTS

| | | |
|---|---|---|
| JP | 2011-036017 A | 2/2011 |
| JP | 2013-206942 A | 10/2013 |
| JP | 2013-211548 A | 10/2013 |
| JP | 2013-239500 A | 11/2013 |
| JP | 2015-056564 A | 3/2015 |
| JP | 5746245 B2 | 7/2015 |
| JP | 2016-051886 A | 4/2016 |
| JP | 6392458 B2 | 9/2018 |

* cited by examiner

Fig.2A B-B'
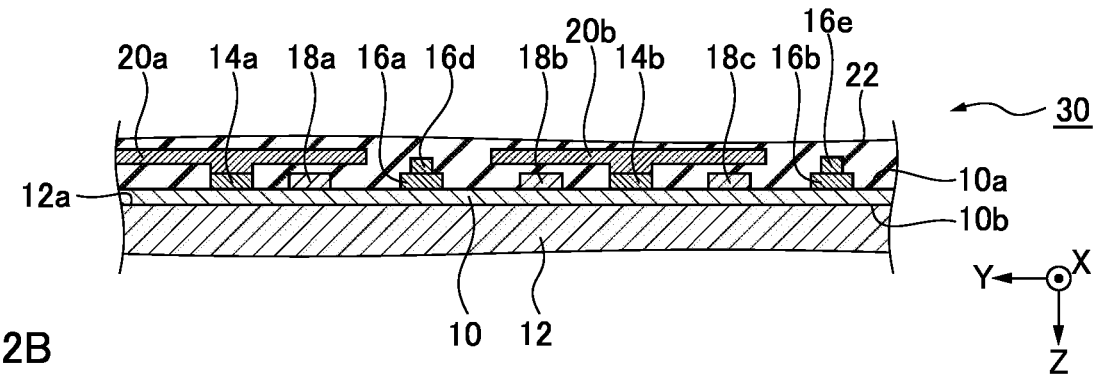
Fig.2B
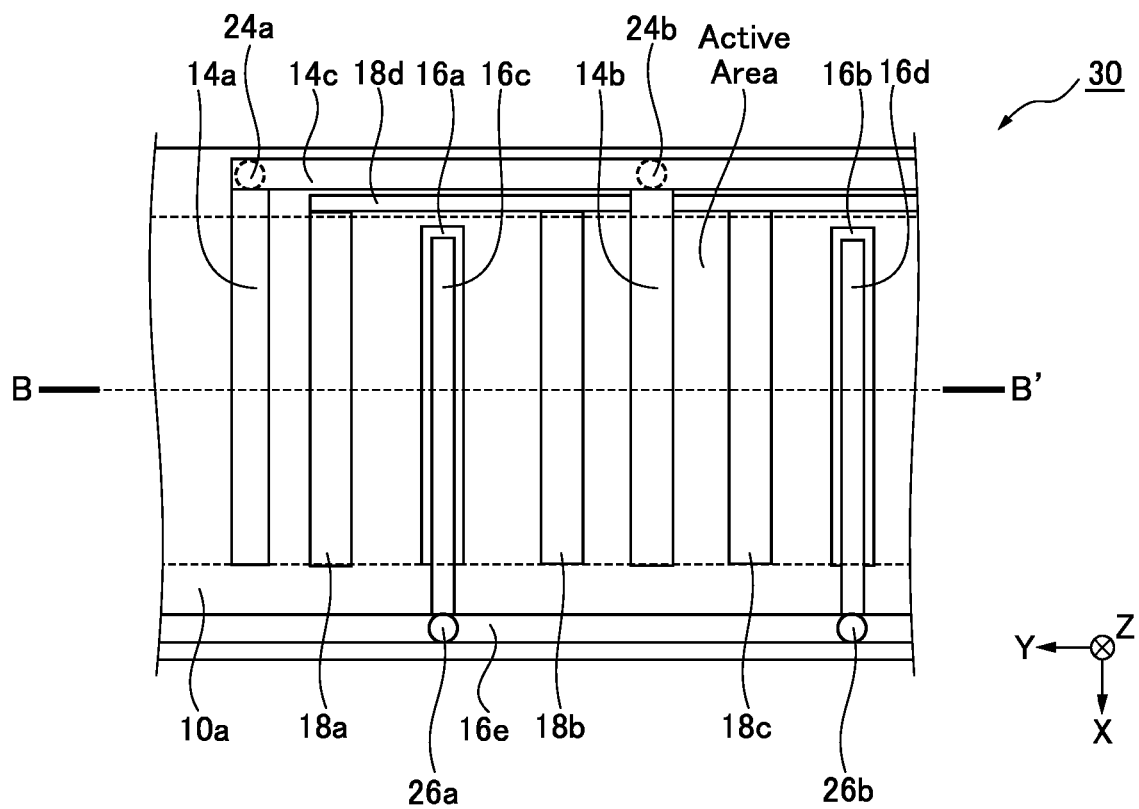
Fig.2C
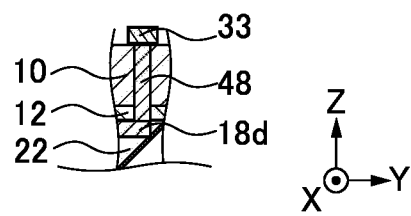

Fig.9
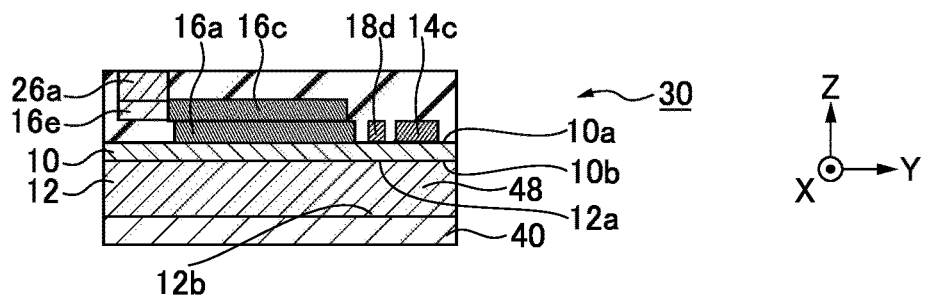
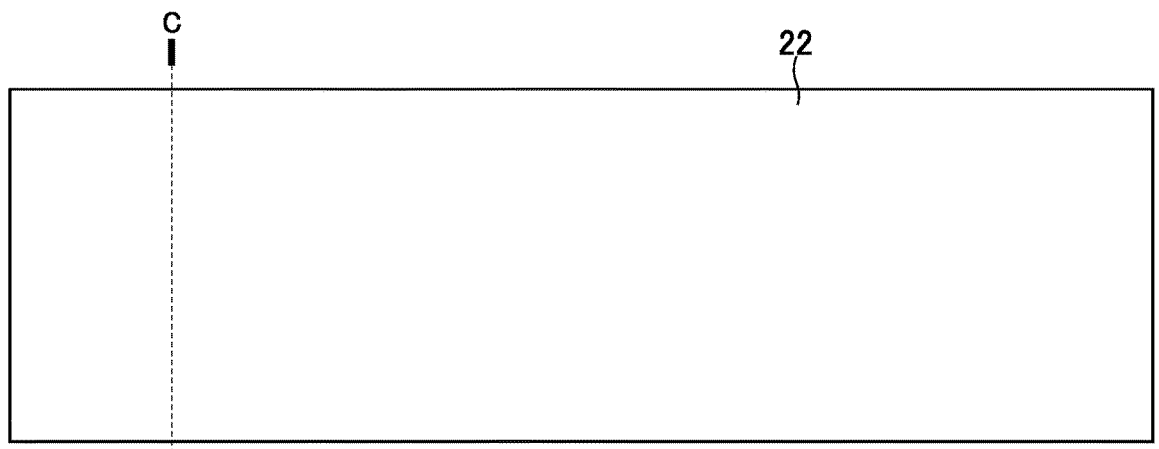
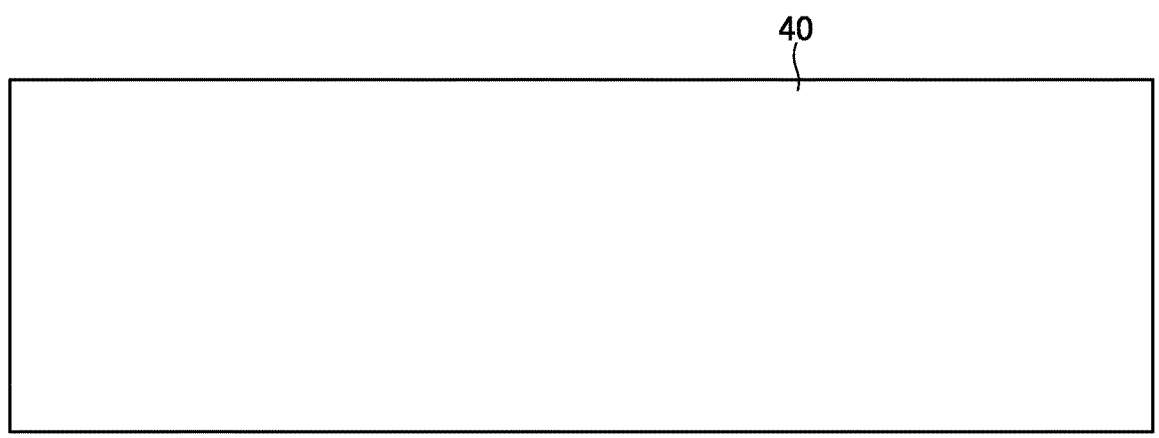

Fig.10 C-C'
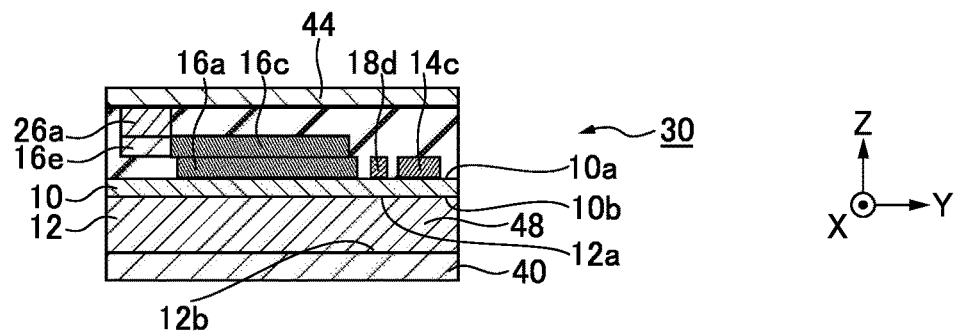
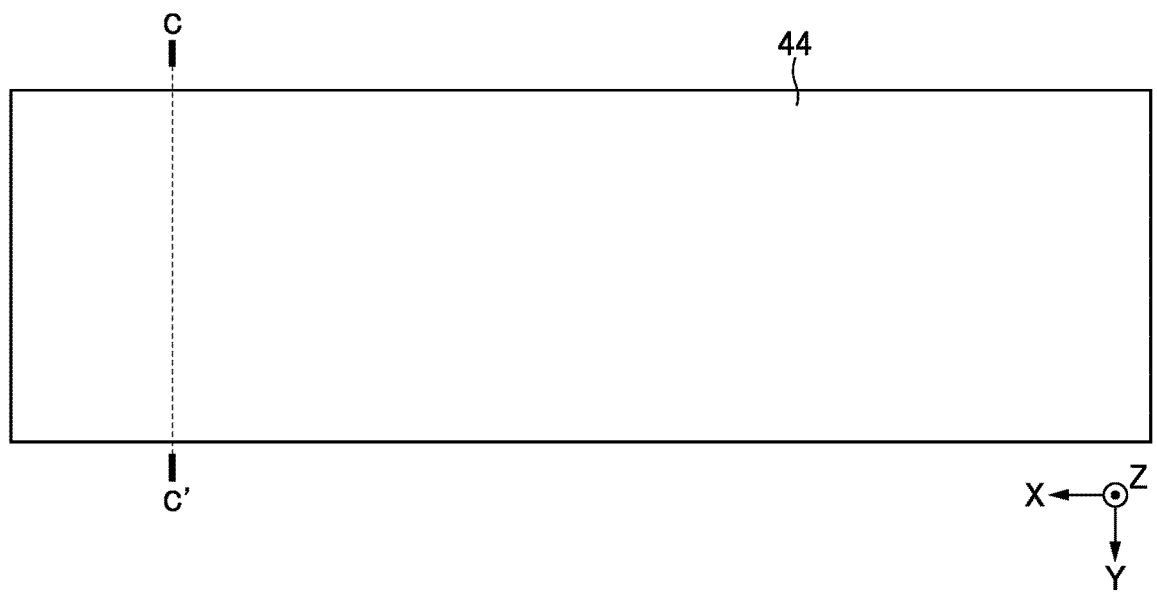
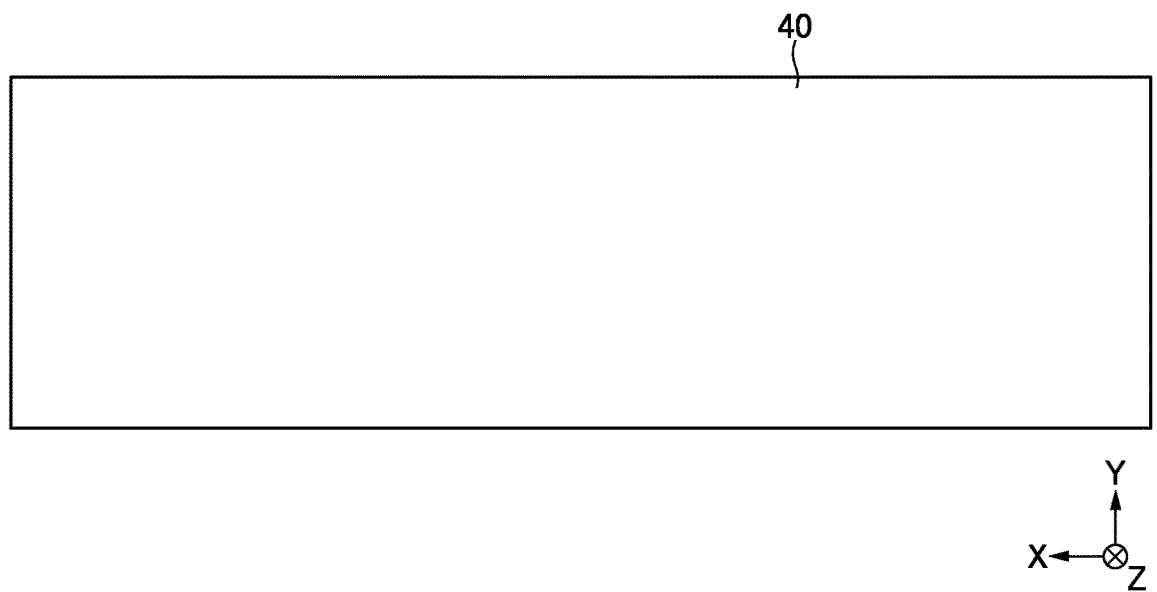

Fig.11
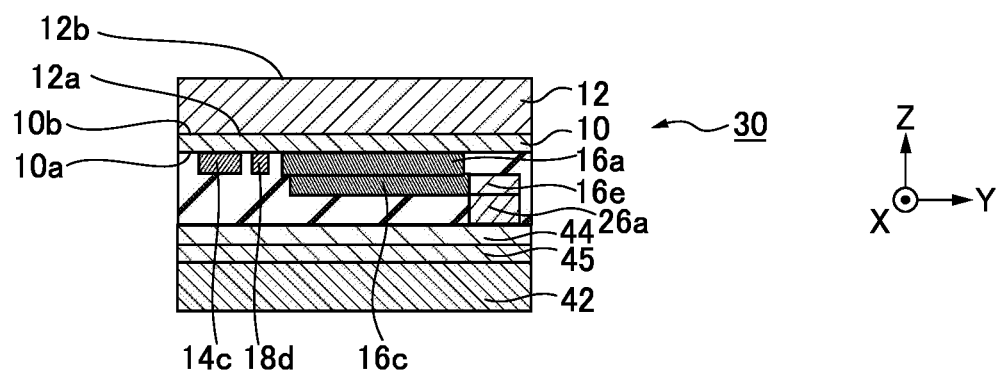
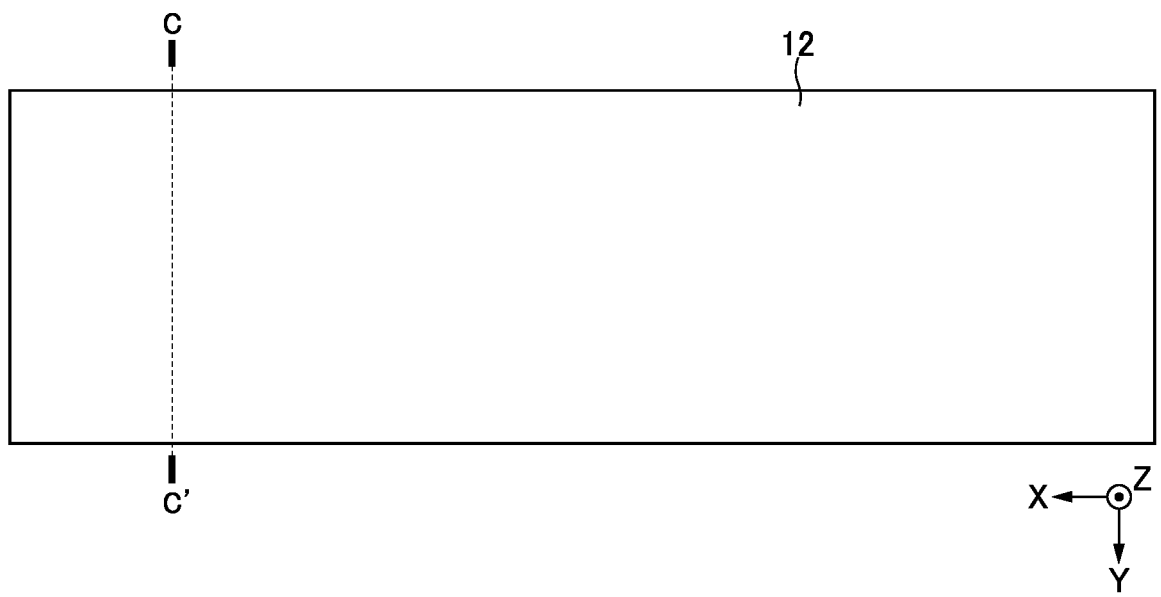
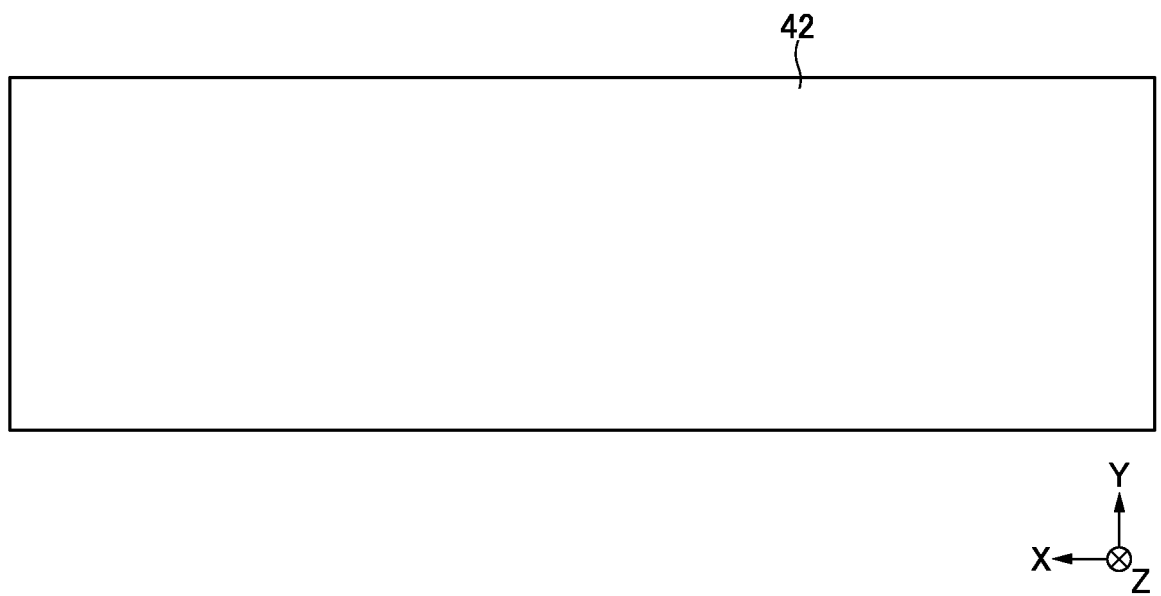

Fig.15
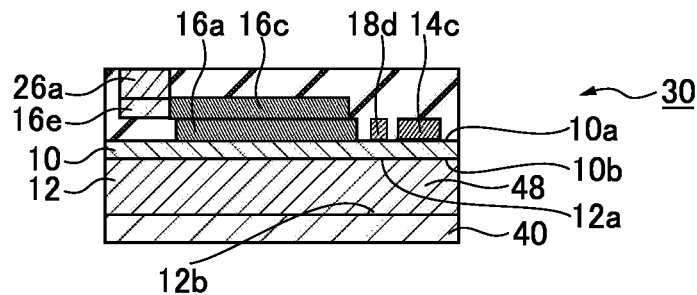
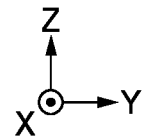
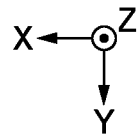
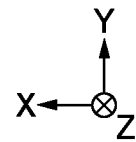

Fig.16
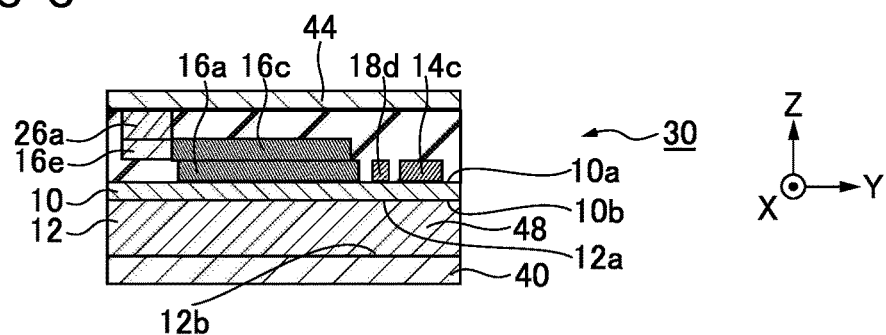
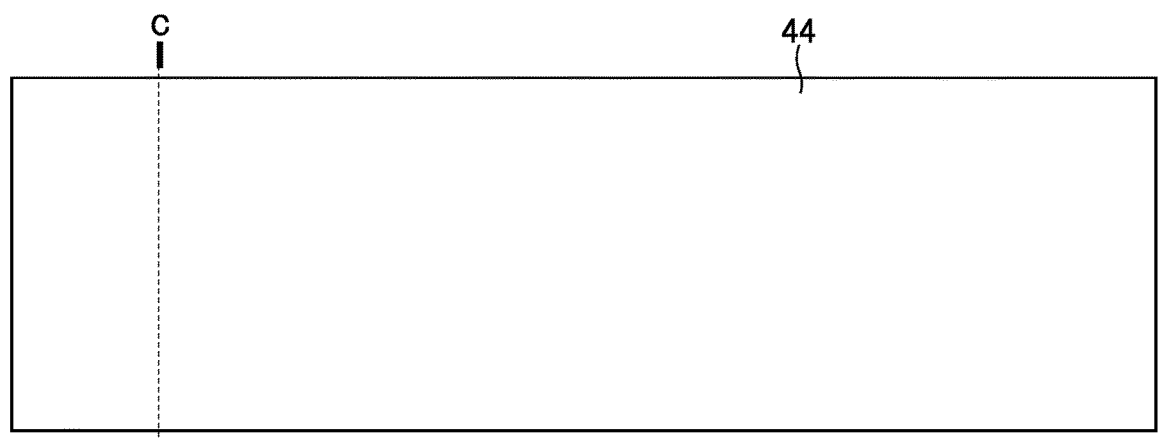
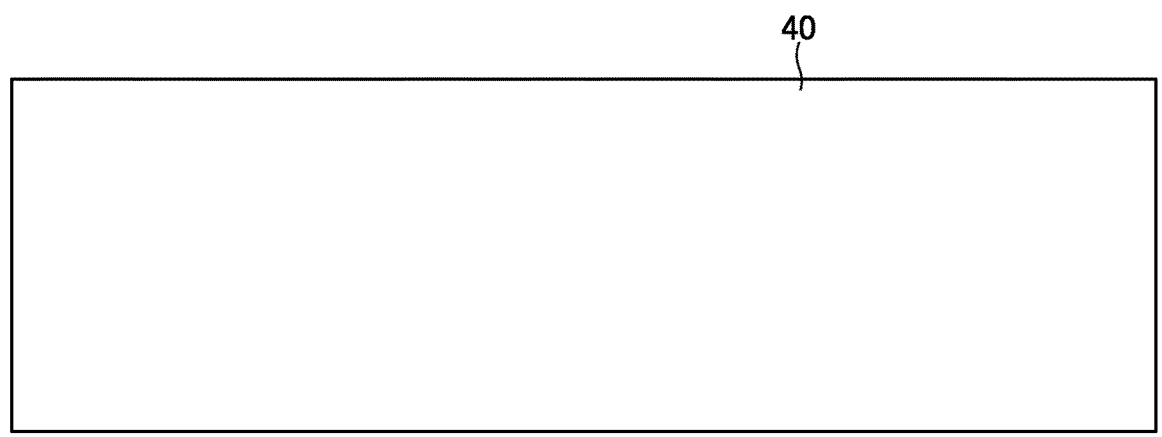

ns a  filed on Sep. 9, 2020, the entire contents of which are
SEMICONDUCTOR DEVICE

CROSS-REFERENCE TO RELATED APPLICATION

This application is based upon and claims the benefit of priority from Japanese Patent Application No. 2020-151229, filed on Sep. 9, 2020, the entire contents of which are incorporated herein by reference.

FIELD

Embodiments described herein relate generally to a semiconductor device.

BACKGROUND

Group III nitrides such as gallium nitride (GaN) semiconductors are expected as materials for next-generation power semiconductor devices. The GaN semiconductor has a larger band gap than silicon (Si). Therefore, a GaN semiconductor device can realize a power semiconductor device having a small size and a high breakdown voltage as compared with a silicon (Si) semiconductor device. In addition, since parasitic capacitance can be reduced, a high-speed driving power semiconductor device can be realized.

In a GaN transistor, a high electron mobility transistor (HEMT) structure using two-dimensional electron gas (2DEG) as a carrier is generally applied. A normal HEMT is a normally-on transistor that becomes conductive without applying a voltage to a gate. For this reason, there is a problem that it is difficult to realize a normally-off transistor that does not become conductive unless a voltage is applied to a gate.

In a power supply circuit or the like that handles large electric power of several hundred V to 1000 V, a normally-off operation is required with emphasis on safety. Therefore, a circuit configuration in which a normally-on GaN transistor and a normally-off Si transistor are cascode-connected to realize a normally-off operation is proposed.

BRIEF DESCRIPTION OF THE DRAWINGS

FIGS. 2A to 2C are schematic views of main parts of a nitride semiconductor device of the first embodiment;

FIG. 9 is a schematic view illustrating a manufacturing process of the semiconductor device of the first embodiment;

FIG. 10 is a schematic view illustrating a manufacturing process of the semiconductor device of the first embodiment;

FIG. 11 is a schematic view illustrating a manufacturing process of the semiconductor device of the first embodiment;

FIG. 15 is a schematic cross-sectional view illustrating a manufacturing process of the semiconductor device of the second embodiment;

FIG. 16 is a schematic cross-sectional view illustrating a manufacturing process of the semiconductor device of the second embodiment.

DETAILED DESCRIPTION

Figure 1:
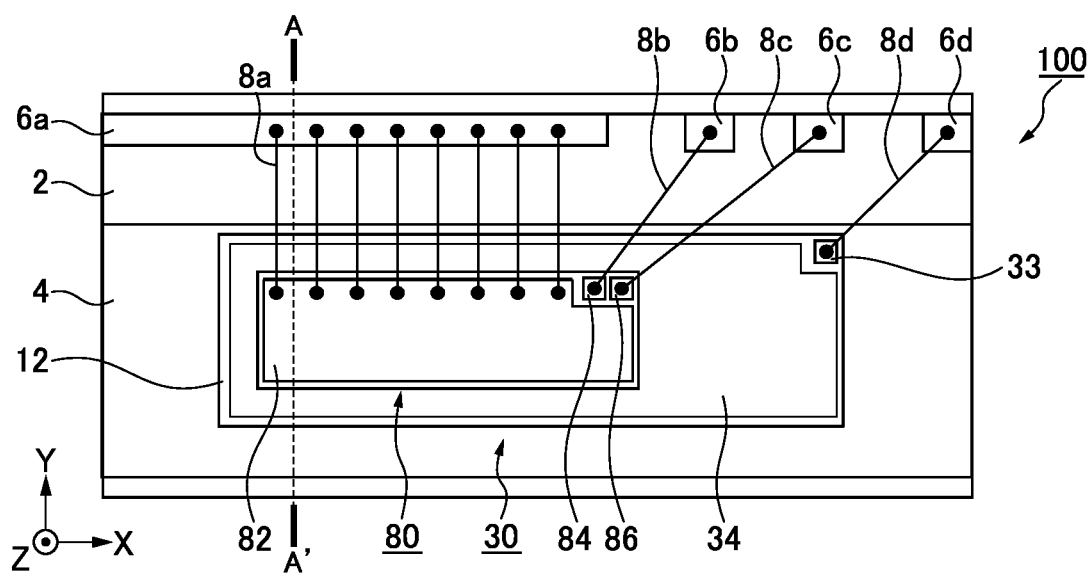
FIG. 1 is a schematic top view of a semiconductor device of a first embodiment.

Hereinafter, embodiments of the present disclosure will be described with reference to the drawings. In the following description, the same members and the like are denoted by the same reference numerals, and the description of the members and the like described once is appropriately omitted.

In the present specification, in order to indicate a positional relation of components and the like, an upward direction of the drawings is described as "above" and a downward direction of the drawings is described as "under". In the present specification, the concepts of "above" and "under" are not necessarily terms indicating relations with a direction of gravity.

Hereinafter, a case where a first-conductivity type is an n type and a second-conductivity type is a p type will be described as an example.

In the following description, notations $n^+$, $n$, and $n^-$ and $p^+$, $p$, and $p^-$ indicate relative levels of impurity concentrations in respective conductivity types. That is, $n^+$ has a relatively higher n-type impurity concentration than $n$, and $n^-$ has a relatively lower n-type impurity concentration than $n$. Further, $p^+$ has a relatively higher p-type impurity concentration than $p$, and $p^-$ has a relatively lower p-type impurity concentration than $p$. Note that the $n^+$ type and the $n^-$ type may be simply described as the n type, and the $p^+$ type and the $p^-$ type may be simply described as the p type.

First Embodiment

A semiconductor device according to the present embodiment includes: a first nitride semiconductor layer having a first surface and a second surface; a first source electrode provided on the first surface; a first drain electrode provided on the first surface; a first gate electrode provided on the first surface between the first source electrode and the first drain electrode; a second nitride semiconductor layer having a third surface and a fourth surface, the third surface being provided on the second surface and facing the second surface, and the second nitride semiconductor layer having a smaller band gap than the first nitride semiconductor layer; and a first semiconductor device having a fifth surface provided on the fourth surface and facing the fourth surface with a size equal to or smaller than a size of the fourth surface, the first semiconductor device including a first semiconductor material having a smaller band gap than the second nitride semiconductor layer.

FIG. 1 is a schematic diagram of a semiconductor device 100 according to the present embodiment. FIGS. 2A to 2C are schematic views of main parts of a nitride semiconductor device 30 according to the present embodiment.

Figure 3:
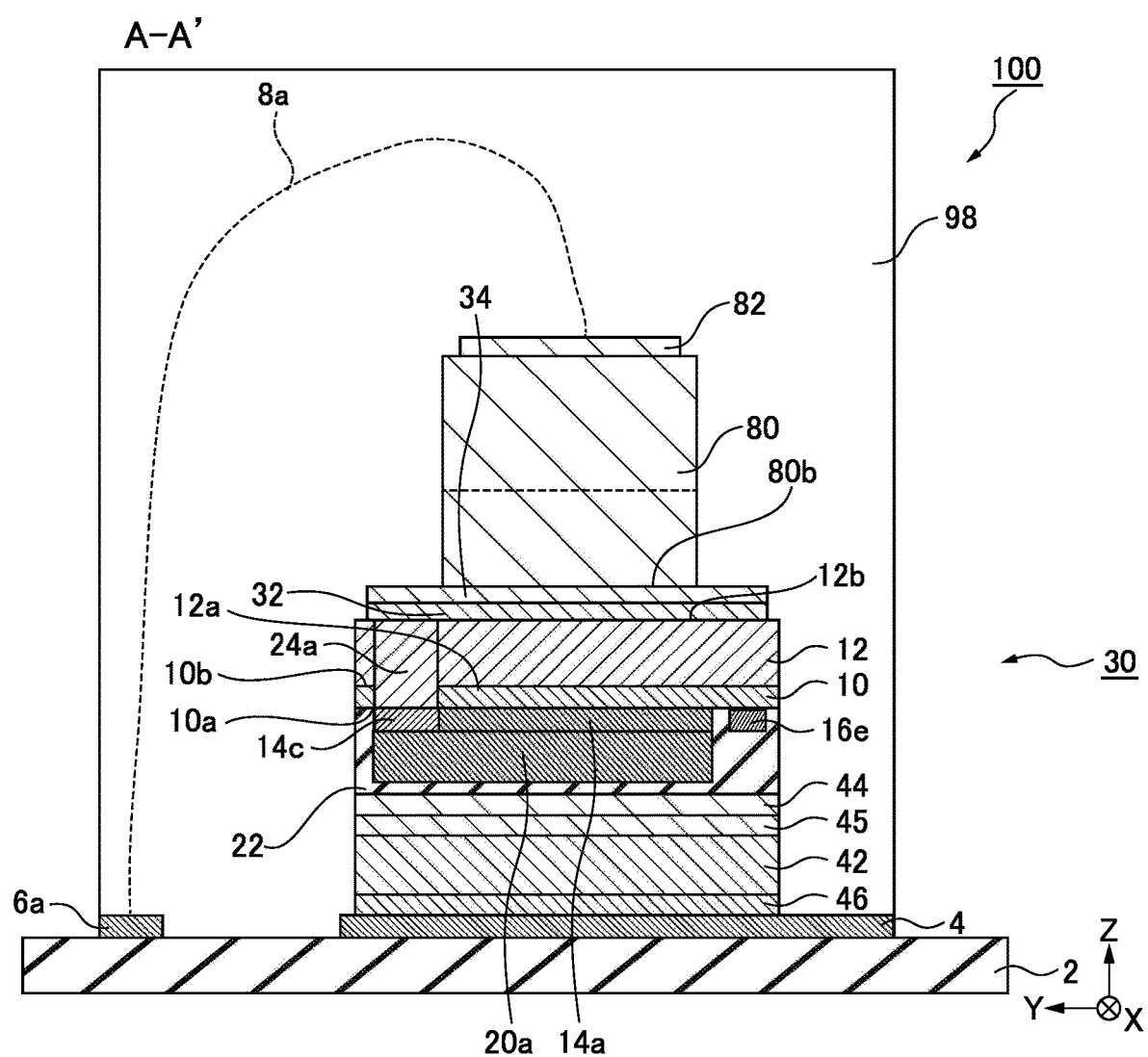
FIG. 3 is an example of a schematic cross-sectional view of the semiconductor device of the first embodiment.
Figure 4:
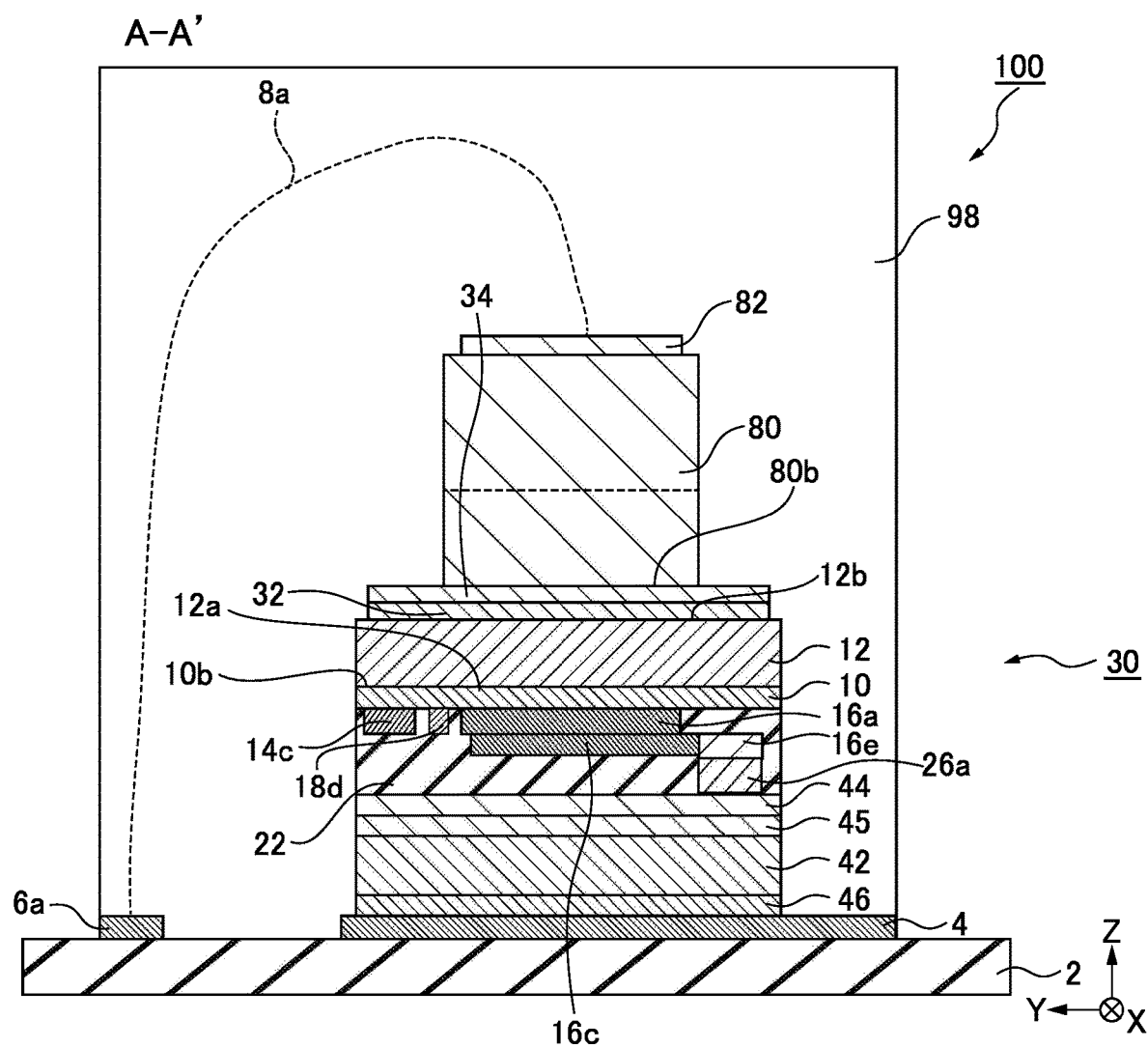
FIG. 4 is another example of a schematic cross-sectional view of the semiconductor device of the first embodiment.
Figure 5:
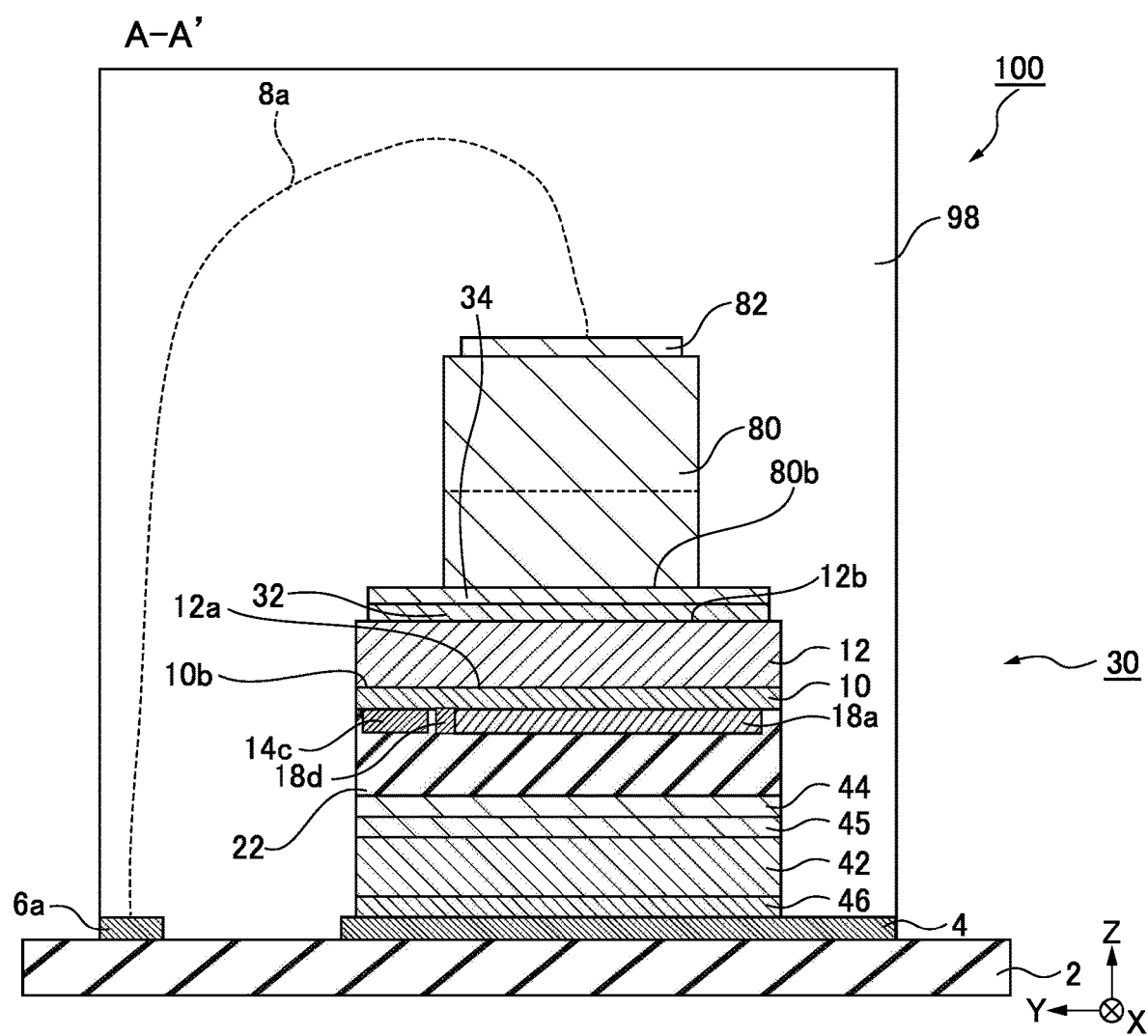
FIG. 5 is another example of a schematic cross-sectional view of the semiconductor device of the first embodiment.

FIG. 3 is an example of a schematic cross-sectional view of the semiconductor device 100 taken along the line A-A' (FIG. 1) passing through a first source electrode 14a, a field plate electrode 20a, a wiring 14c, and a first via 24a (FIG. 2B). FIG. 4 is an example of a schematic cross-sectional view of the semiconductor device 100 taken along the line A-A' (FIG. 1) passing through a first drain electrode 16a, a wiring 16c, a wiring 16e, and a third via 26a (FIG. 2B). FIG. 5 is an example of a schematic cross-sectional view of the semiconductor device 100 taken along the line A-A' (FIG. 1) passing through a first gate electrode 18a and a wiring 18d (FIG. 2B). As described above, since a plurality of types of cross-sectional views are assumed for a cross section taken along the line A-A' (FIG. 1), these cross-sectional views are illustrated in FIGS. 3, 4, and 5.

The semiconductor device 100 according to the present embodiment will be described using FIGS. 1 to 5. The semiconductor device 100 according to the present embodiment is a device in which a nitride semiconductor device 30 and a MOSFET (an example of a first semiconductor device) 80 are electrically connected in series.

An insulating substrate 2 is a substrate on which a circuit or the like is formed, for example.

Here, an X direction, a Y direction perpendicular to the X direction, and a Z direction perpendicular to the X direction and the Y direction are defined. It is assumed that the insulating substrate 2 is provided parallel to an XY plane.

A lead frame 4 is provided on the insulating substrate 2. The lead frame 4 is used for electrical connection between an external electric circuit (not illustrated) and the semiconductor device 100. The lead frame 4 is formed of, for example, copper (Cu) or aluminum (Al).

A fourth conductive layer 46 is provided on the lead frame 4. The fourth conductive layer 46 electrically connects the lead frame 4 and the nitride semiconductor device 30. The fourth conductive layer 46 is, for example, solder or silver paste as a die bonding material. However, the material used for the fourth conductive layer 46 is not limited thereto.

A second substrate 42 having electrical conductivity is provided on the fourth conductive layer 46 and is electrically connected to the fourth conductive layer 46. The second substrate 42 is, for example, an electrically conductive silicon (Si) substrate doped with impurities, but is not limited thereto.

A third conductive layer 45 is provided on the second substrate 42 and is electrically connected to the second substrate 42. The third conductive layer 45 preferably includes, for example, an Au (gold)/Sn (tin) alloy, or Au (gold) and Sn (tin). However, the material used for the third conductive layer is not limited thereto.

The nitride semiconductor device 30 is provided on the third conductive layer 45. The nitride semiconductor device 30 is, for example, a high electron mobility transistor (HEMT).

The nitride semiconductor device 30 includes a first nitride semiconductor layer 10, a second nitride semiconductor layer 12, a first source electrode 14, a first drain electrode 16, a first gate electrode 18, a field plate electrode 20, an interlayer insulating film 22, a second conductive layer 44, a third via 26, a first via 24, a conductive material 32, a wiring 47, and a second via 48.

The first nitride semiconductor layer 10 has a first surface 10a and a second surface 10b. The first nitride semiconductor layer 10 is disposed so that the first surface 10a faces downward. The first nitride semiconductor layer 10 is, for example, undoped $Al_YGa_{1-Y}N$ ($0<Y\leq 1$ and $X<Y$). More specifically, the first nitride semiconductor layer 10 is, for example, undoped $Al_{0.2}Ga_{0.8}N$. A film thickness of the first nitride semiconductor layer is, for example, equal to or more than 15 nm and equal to or less than 50 nm.

The second nitride semiconductor layer 12 has a third surface 12a and a fourth surface 12b. The third surface 12a is provided on the second surface 10b, faces the second surface 10b, and is in contact with the second surface 10b. A band gap of the second nitride semiconductor layer 12 is smaller than a band gap of the first nitride semiconductor layer 10. The second nitride semiconductor layer 12 is, for example, $Al_XGa_{1-X}N$ ($0\leq X<1$). Note that the second nitride semiconductor layer 12 may further include, for example, a multilayer structure of aluminum gallium nitride ($Al_WGa_{1-W}N$ ($0<W<1$)). More specifically, the first nitride semiconductor layer 10 is, for example, GaN. A film thickness of the second nitride semiconductor layer 12 is, for example, equal to or more than 0.5 μm and equal to or less than 10 μm.

A heterojunction interface is formed between the first nitride semiconductor layer 10 and the second nitride semiconductor layer 12. When the nitride semiconductor device 30 is turned on, two-dimensional electron gas (2DEG) is formed at the heterojunction interface and becomes a carrier.

The first source electrode 14 is provided on the first surface 10a. The first drain electrode 16 is provided on the first surface 10a. The first gate electrode 18 is provided on the first surface 10a between the first source electrode 14 and the first drain electrode 16. The first source electrode 14, the first drain electrode 16, and the first gate electrode 18 are, for example, metal electrodes. The metal electrode used for the first source electrode 14, the first gate electrode 18, or the first drain electrode 16 has, for example, a stacked structure of Ti (titanium) and Al or a stacked structure of Ni (nickel) and Au (gold). Note that an insulating film including, for example, silicon nitride (SiN), silicon oxide ($SiO_2$), or aluminum oxide ($Al_2O_3$) may be provided between the first nitride semiconductor layer 10 and the first gate electrode 18. Further, a nitride semiconductor layer including p-type impurities may be provided between the first nitride semiconductor layer 10 and the first gate electrode 18.

The field plate electrode 20 is provided under the first source electrode 14 and is electrically connected to the first source electrode 14. The field plate electrode is used to relax an electric field in the nitride semiconductor device 30.

The interlayer insulating film 22 is provided between the first surface 10a and the third conductive layer 45. The interlayer insulating film 22 includes, for example, polyimide, benzocyclobutene (BCB), SiN, or $SiO_2$, but is not limited thereto.

The second conductive layer 44 is provided between the interlayer insulating film 22 and the third conductive layer 45. The second conductive layer 44 is, for example, a conductive layer including an electrically conductive material such as a metal including Al, W (tungsten), or Cu.

The third via 26 is provided between the second conductive layer 44 and the first drain electrode 16 and electrically connects the second conductive layer 44 and the first drain electrode 16. The third via 26 is, for example, a via including an electrically conductive material such as a metal including Al, W, or Cu.

The first via 24 is electrically connected to the first source electrode 14 and penetrates the first nitride semiconductor layer 10 and the second nitride semiconductor layer 12. The first via 24 is, for example, a via including an electrically conductive material such as a metal including Al, W, or Cu.

The conductive material (an example of a first conductive layer) 32 is provided on the second nitride semiconductor layer 12 and is electrically connected to the first via 24. A bonding material (an example of the first conductive layer) 34 is provided on the conductive material 32 and is electrically connected to the conductive material 32. The conductive material 32 includes, for example, an electrically conductive material such as a metal and is formed simultaneously with, for example, the first via 24. Note that the conductive material 32 may not be formed simultaneously with the first via 24. The bonding material 34 is, for example, solder or silver paste as a die bonding material.

A first gate pad 33 is provided on the second nitride semiconductor layer 12 and is electrically connected to the first gate electrode 18 of the nitride semiconductor device 30 as described later. The first gate pad 33 is electrically connected to a pad 6d provided on the insulating substrate 2 using a bonding wire 8d including Au (gold) or Cu, for example.

A MOSFET 80 is provided on the bonding material 34. The MOSFET 80 has a fifth surface 80b facing the fourth surface 12b with a size equal to or smaller than a size of the fourth surface 12b. A second source pad 82, a second Kelvin pad 84, and a second gate pad 86 are provided on a top surface of the MOSFET 80. The second source pad 82 is electrically connected to a pad 6a provided on the insulating substrate 2 using a bonding wire 8a, for example. The second Kelvin pad 84 is electrically connected to a pad 6b provided on the insulating substrate 2 using a bonding wire 8b, for example. The second gate pad 86 is electrically connected to a pad 6c provided on the insulating substrate 2 using a bonding wire 8c, for example.

Next, description will be given using FIGS. 2A to 2C. FIG. 2B is a schematic bottom view of the nitride semiconductor device 30 of the present embodiment. FIG. 2A is a schematic cross-sectional view of the nitride semiconductor device 30 of the present embodiment taken along the line B-B' of FIG. 2B. FIG. 2C is a schematic cross-sectional view illustrating a connection aspect of the wiring 18d and the first gate pad 33. Note that the field plate electrode 20 and the interlayer insulating film 22 illustrated in FIG. 2A are not illustrated in FIG. 2B.

The nitride semiconductor device 30 of the present embodiment has, for example, a multi-finger structure. A first drain electrode 16a as the first drain electrode 16 is provided between a first source electrode 14a and a first source electrode 14b as the first source electrode 14. A first gate electrode 18a as the first gate electrode 18 is provided between the first source electrode 14a and the first drain electrode 16a. A first gate electrode 18b as the first gate electrode 18 is provided between the first source electrode 14b and the first drain electrode 16a. A first gate electrode 18c as the first gate electrode 18 is provided between the first source electrode 14b and the first drain electrode 16b. A field plate electrode 20a as the field plate electrode 20 is electrically connected to the first source electrode 14a. A field plate electrode 20b as the field plate electrode 20 is electrically connected to the first source electrode 14b.

A wiring 14c is electrically connected to the first source electrode 14a and the first source electrode 14b. In addition, a first via 24a and a first via 24b as the first via 24 are connected to the wiring 14c. As a result, the first source electrode 14 is electrically connected to the first via 24. A wiring 16c is electrically connected to the first drain electrode 16a. A wiring 16d is electrically connected to the first drain electrode 16b. A wiring 16e is electrically connected to the wiring 16c and the wiring 16d. A third via 26a and a third via 26b as the third via 26 are connected to the wiring 16e. As a result, the first drain electrode 16 is electrically connected to the third via 26. A wiring 18d is electrically connected to the first gate electrode 18a, the first gate electrode 18b, and the first gate electrode 18c. The wiring 18d is connected to the second via 48 including an electrically conductive material such as metal, for example, Al, W, or Cu. The second via 48 penetrates the first nitride semiconductor layer 10 and the second nitride semiconductor layer 12. The second via 48 is electrically connected to the first gate pad 33. As a result, the first gate pad 33 is electrically connected to the first gate electrode 18. Note that a region indicated by a dotted line in FIG. 2B is an active area of the nitride semiconductor device 30.

Figure 6:
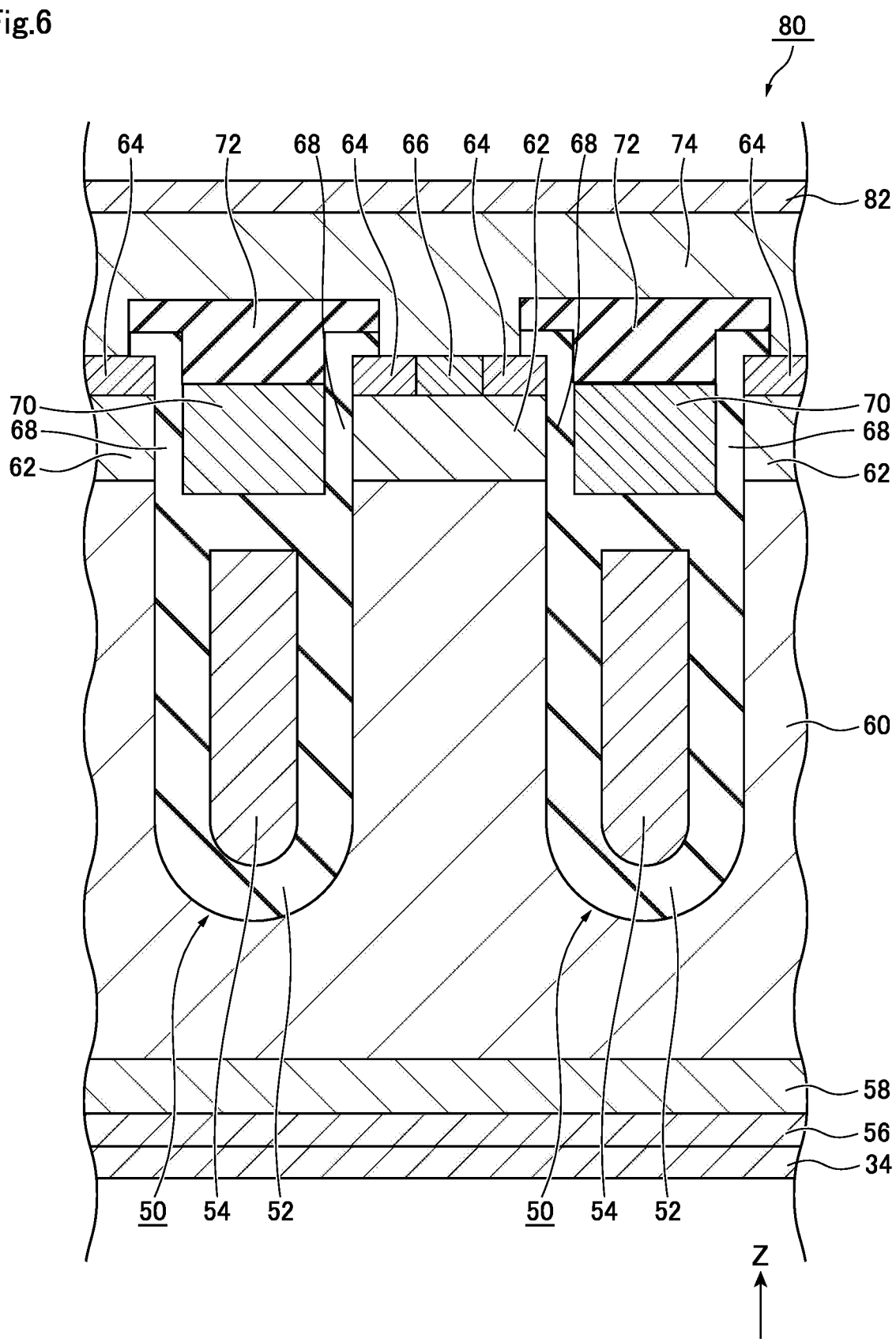
FIG. 6 is a schematic cross-sectional view of a main part of a MOSFET of the first embodiment.

FIG. 6 is a schematic cross-sectional view of a main part of the MOSFET 80 according to the present embodiment. The MOSFET 80 of the present embodiment is, for example, a vertical trench type Si (silicon) MOSFET. Note that Si is an example of a first semiconductor material having a smaller band gap than the second nitride semiconductor layer 12.

The second drain electrode 56 is provided on the bonding material 34 and is electrically connected to the bonding material 34. The second drain electrode 56 is an electrode that functions as a drain electrode of the MOSFET 80. The second drain electrode 56 includes, for example, an electrically conductive material such as a metal.

A drain layer (an example of a first semiconductor layer) 58 is provided on the second drain electrode 56. The drain layer 58 is a layer that functions as a drain of the MOSFET 80. The drain layer 58 includes, for example, $n^+$-type Si.

A drift layer (an example of a second semiconductor layer) 60 is provided on the drain layer 58. The drift layer 60 is a layer that functions as a drift layer of the MOSFET. The drift layer 60 includes, for example, $n^-$-type Si.

A base region (an example of a first semiconductor region) 62 is provided on the drift layer 60. The base region 62 is a region that functions as a base of the MOSFET 80. The base region 62 is a region that forms a channel when a voltage is applied to a second gate electrode 70 to be described later and allows carriers to flow between the drain layer 58 and a source region 64 to be described later. The base region 62 includes, for example, p-type Si.

The source region (an example of a second semiconductor region) 64 is provided on the base region 62. The source region 64 is a region that functions as a source of the MOSFET 80. When an appropriate voltage is applied to the second gate electrode 70, carriers flow between the source region 64 and the drain layer 58. The source region 64 includes, for example, $n^+$-type Si.

A contact region 66 is provided on the base region 62 and is electrically connected to the base region 62 and the source region 64. The contact region 66 is provided to further improve electrical contact between the base region 62 and the source region 64, and a second source electrode 74 described later. The contact region 66 includes, for example, $p^+$-type Si.

A trench 50 is provided so as to reach the drift layer 60 from above the source region 64.

An insulating film 52 is provided in the trench 50. For example, the insulating film 52 is provided so as to cover the field plate electrode 54 described later. For example, the insulating film 52 includes SiOx (silicon oxide).

A gate insulating film 68 is provided on the insulating film 52 in the trench 50. Further, the gate insulating film 68 is provided between the second gate electrode 70 and the base region 62. The gate insulating film 68 includes, for example, SiOx (silicon oxide).

The field plate electrode 54 is provided in the trench 50 so as to face the drift layer 60 with the insulating film 52 therebetween. For example, the field plate electrode 54 is provided side by side with the drift layer 60. The field plate electrode 54 has, for example, a portion extending upward in a portion (not illustrated) provided in a depth direction in FIG. 6. In addition, the field plate electrode 54 is electrically connected to the second source electrode 74 described later by using the portion extending upward.

The interlayer insulating film 72 is provided on the gate insulating film 68 and the second gate electrode 70. The interlayer insulating film 72 includes, for example, SiOx (silicon oxide).

The second source electrode 74 is provided on the source region 64, the interlayer insulating film 72, and the contact region 66. The second source electrode 74 includes an electrically conductive material such as a metal.

The second source pad 82 is provided on the second source electrode 74 and is electrically connected to the second source electrode 74. The second source pad 82 includes an electrically conductive material such as a metal.

Note that the second gate pad 86 (FIG. 1) is electrically connected to, for example, the second gate electrode 70.

Note that the semiconductor device 100 may include both the MOSFET 80 and the control circuit 90, or may include either the MOSFET 80 or the control circuit 90.

Figure 7:
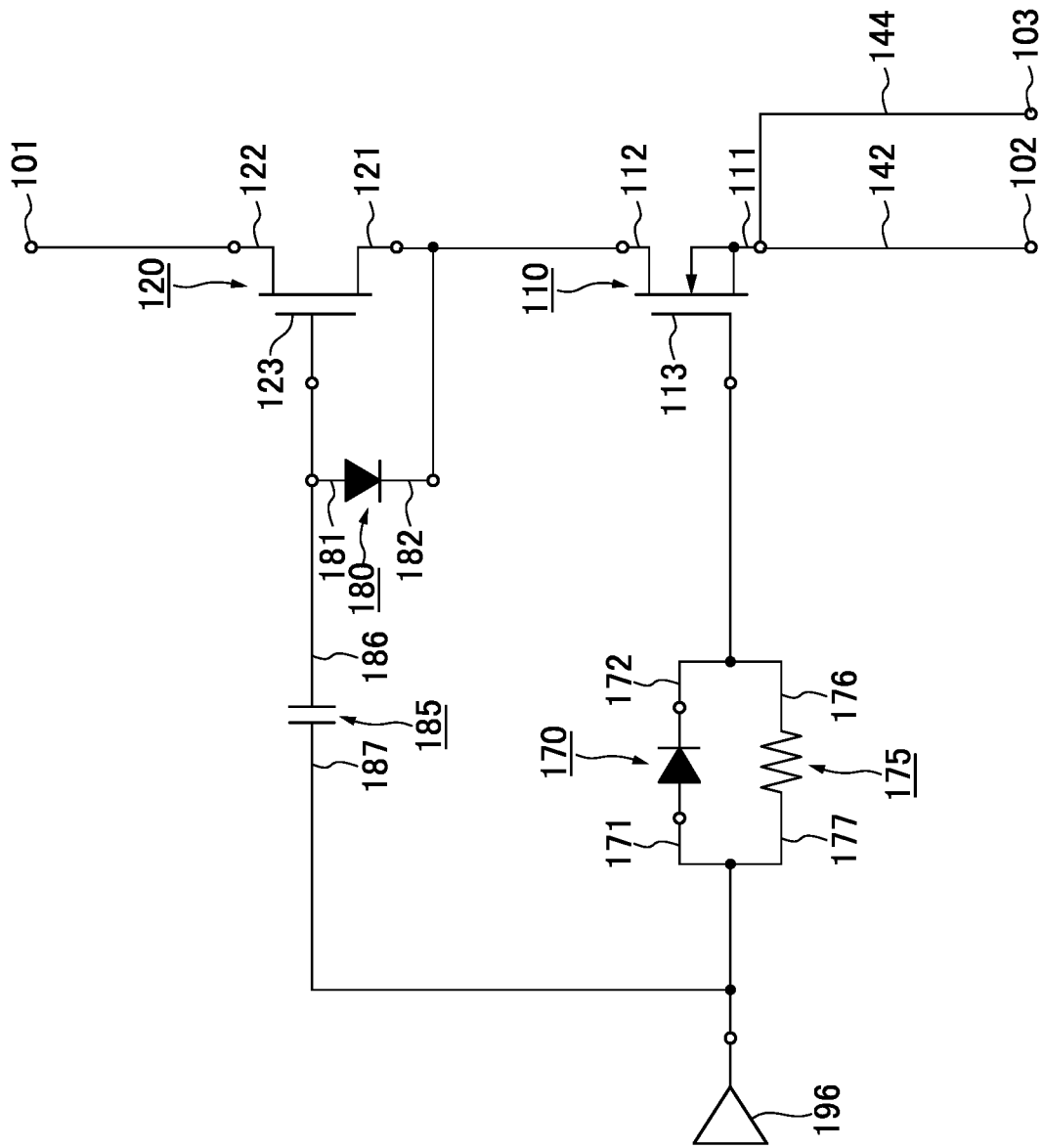
FIG. 7 is an example of an electric circuit diagram configured by the semiconductor device of the first embodiment.

FIG. 7 is an example of an electric circuit diagram configured by the semiconductor device 100 according to the present embodiment. FIG. 7 illustrates an electric circuit in which a drain electrode 112 of a normally-off transistor 110 and a source electrode 121 of a normally-on transistor 120 are cascode-connected. The normally-off transistor 110 and the normally-on transistor 120 are electrically connected in series, so that a normally-off operation is realized.

The normally-off transistor 110 includes a source electrode 111, a drain electrode 112, and a gate electrode 113. The normally-off transistor 110 corresponds to the MOSFET 80 (for example, FIG. 1). A breakdown voltage of the normally-off transistor 110 is, for example, equal to or more than 10 V or equal to or less than 30 V.

A wiring 142 is connected to the source electrode 111. The wiring 142 is connected to a source terminal 102. The source terminal 102 corresponds to, for example, the second source pad 82.

Further, a wiring 144 is connected to the source electrode 111. The wiring 144 is connected to a terminal 103. The terminal 103 corresponds to, for example, the second Kelvin pad 84.

The normally-on transistor 120 includes a source electrode 121, a drain electrode 122, and a gate electrode 123. The normally-on transistor 120 corresponds to the nitride semiconductor device 30 (for example, FIG. 1). A breakdown voltage of the normally-on transistor 120 is, for example, equal to or more than 600 V and equal to or less than 1200 V.

A capacitor 185 has a first end 186 and a second end 187. The first end 186 is electrically connected to the gate electrode 123.

A diode 180 has an anode 181 and a cathode 182. The anode 181 is electrically connected to the first end 186 and the gate electrode 123. The cathode 182 is electrically connected to the source electrode 121.

A resistor 175 has an end 176 and an end 177. The end 176 is electrically connected to the gate electrode 113.

A diode 170 has an anode 171 and a cathode 172. The anode 171 is electrically connected to the end 177. The cathode 172 is electrically connected to the gate electrode 113 and the end 176. The diode 170 is provided electrically in parallel with the resistor 175.

A gate drive circuit 196 is electrically connected to the second end 187, the end 177, and the anode 171. The gate drive circuit 196 outputs a signal for driving the normally-off transistor 110 and the normally-on transistor 120.

The operation of the electric circuit illustrated in FIG. 7 is described in, for example, Japanese Patent No. 6392458.

Figure 8:
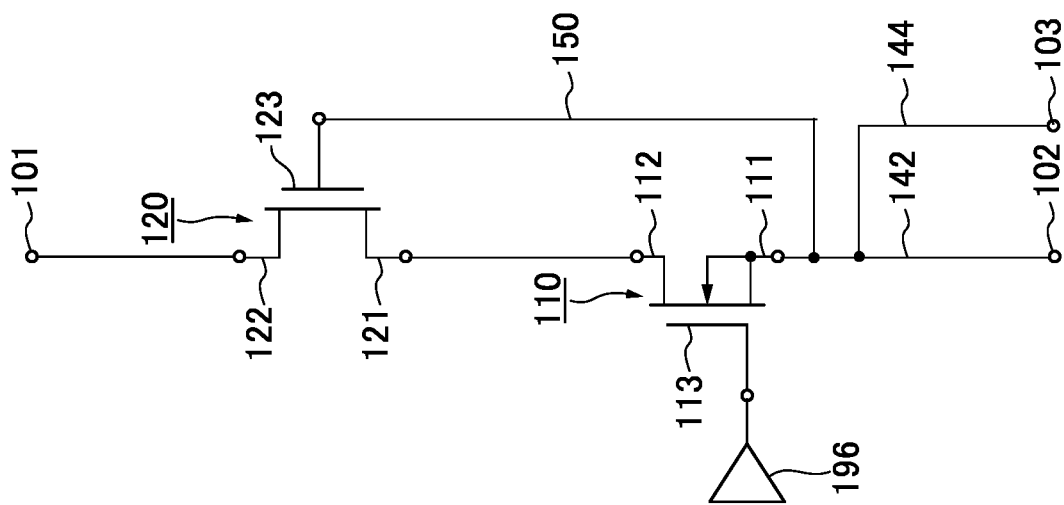
FIG. 8 is another example of an electric circuit diagram configured by the semiconductor device of the first embodiment.

FIG. 8 is another example of an electric circuit diagram configured by the semiconductor device 100 according to the present embodiment. The gate drive circuit 196 is connected to the gate electrode 113 and is not connected to the gate electrode 123. Further, the source electrode 111 and the gate electrode 123 are connected by a wiring 150. FIG. 8 is another example of an electric circuit in which the source electrode 111 of the normally-off transistor 110 and the gate electrode 123 of the normally-on transistor 120 are cascode-connected.

FIGS. 9 to 12 are schematic views illustrating manufacturing processes of the semiconductor device of the present embodiment. Note that a top view is illustrated at the center of each of FIGS. 9 to 12. A cross-sectional view taken along the line C-C' is illustrated on the top of each of FIGS. 9 to 12. A bottom view is illustrated on the bottom of each of FIGS. 9 to 12.

First, the second nitride semiconductor layer 12 and the first nitride semiconductor layer 10 are formed on a first substrate 40 by, for example, a metal organic chemical vapor deposition (MOCVD). In addition, the first source electrode 14, the first drain electrode 16, the first gate electrode 18, the field plate electrode 20, the interlayer insulating film 22, and the third via 26 are formed. The first substrate 40 is, for example, a Si substrate or a sapphire substrate (FIG. 9).

Next, the second conductive layer 44 is formed on the interlayer insulating film 22 (FIG. 10).

Next, the third conductive layer 45 including, for example, an Au/Sn alloy is formed on the second conductive layer 44. Next, the second substrate 42 and the second conductive layer 44 are connected via the third conductive layer 45. Next, the first substrate 40 is removed. When the first substrate 40 is a Si substrate, the first substrate 40 is removed by chemical etching using, for example, a potassium hydroxide (KOH) aqueous solution. When the first substrate 40 is a sapphire substrate, the first substrate 40 is removed by laser lift-off, for example. Next, the semiconductor device in the middle of being manufactured is turned upside down (FIG. 11).

Figure 12:
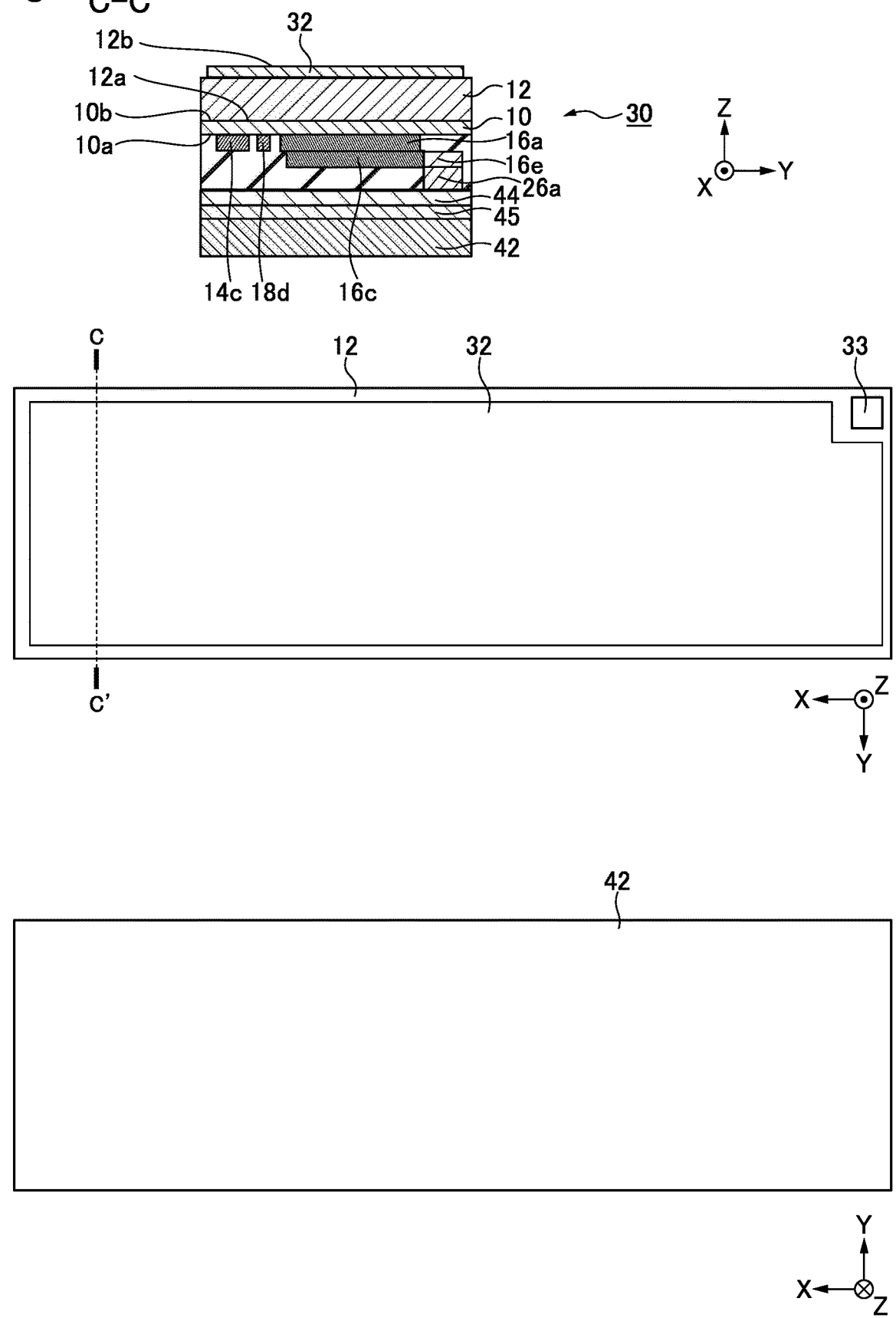
FIG. 12 is a schematic view illustrating a manufacturing process of the semiconductor device of the first embodiment.

Next, the first via 24 electrically connected to the first source electrode 14 and penetrating the first nitride semiconductor layer 10 and the second nitride semiconductor layer 12, the second via 48 electrically connected to the first gate electrode 18, the conductive material 32 provided on the second nitride semiconductor layer 12 and electrically connected to the first via 24, and the first gate pad 33 provided on the second nitride semiconductor layer 12 and electrically connected to the second via 48 are formed (FIG. 12).

Next, the second substrate 42 of the semiconductor device in the middle of being manufactured is thinned by backside grinding to be divided into individual chips. Next, the second substrate 42 is bonded onto the lead frame 4 by the fourth conductive layer 46. Next, the MOSFET 80 is bonded onto the bonding material 34, the control circuit 90 and the bonding wire 8 are appropriately bonded, and sealing with a mold resin or package dicing is appropriately performed to obtain the semiconductor device 100 of the present embodiment.

Next, functions and effects of the semiconductor device 100 according to the present embodiment will be described.

Figure 13:
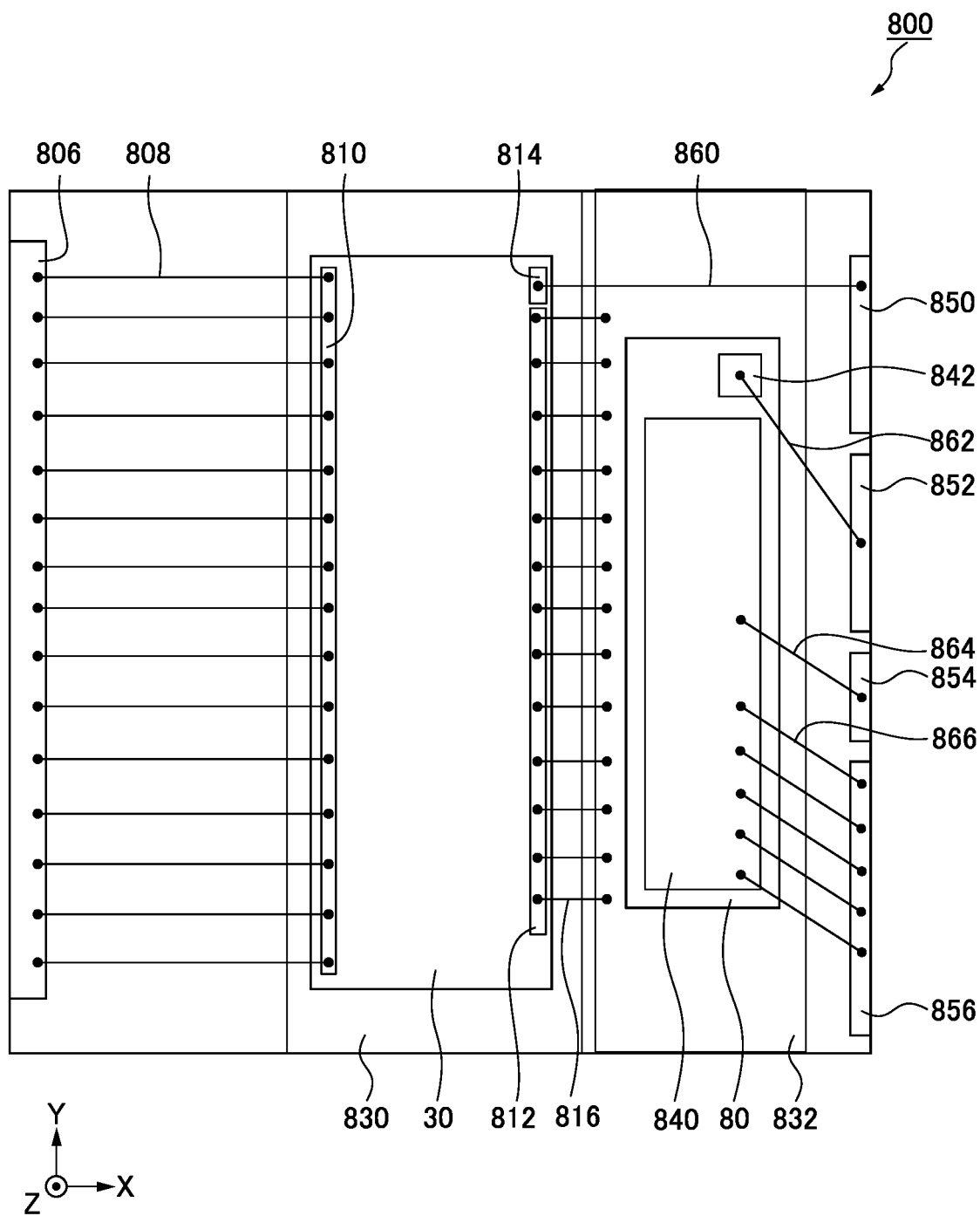
FIG. 13 is a schematic diagram of a semiconductor device of a comparative example.

FIG. 13 is a schematic diagram of a semiconductor device 800 according to a comparative example. Both the nitride semiconductor device 30 and the MOSFET 80 are disposed in the same XY plane. A terminal 806 and a drain terminal 810 of the nitride semiconductor device 30 are electrically connected by a bonding wire 808. A source terminal 812 of the nitride semiconductor device 30 is electrically connected to a metal plate 832 by a bonding wire 816. The MOSFET 80 is provided on the metal plate 832, and a drain electrode of the MOSFET 80 (not illustrated) is electrically connected to the metal plate 832. A source electrode 840 provided on a top surface of the MOSFET 80 is electrically connected to a terminal 856 by a bonding wire 866.

A gate electrode 814 of the nitride semiconductor device 30 is electrically connected to a terminal 850 by a bonding wire 860. A gate electrode 842 of the MOSFET 80 is electrically connected to a terminal 852 by a bonding wire 862.

The source electrode 840 is electrically connected to a terminal 854 by a bonding wire 864. The terminal 854 is used, for example, for Kelvin connection.

In an electric circuit in which the normally-on nitride semiconductor device 30 and the normally-off MOSFET 80 are cascode-connected to realize a normally-off operation, two transistors are mounted. Therefore, when both the nitride semiconductor device 30 and the MOSFET 80 are mounted in the XY plane, there is a problem that a package size increases.

In addition, when both the nitride semiconductor device 30 and the MOSFET 80 are mounted in the XY plane, there is a problem that the resistance of the bonding wire for connecting the nitride semiconductor device 30 and the MOSFET 80 increases, and the on-resistance as the semiconductor device increases. For example, since it is preferable to provide a distance between the terminal 806 and the drain terminal 810 in order to increase a creeping distance, it is preferable to increase the length of the bonding wire 808. Then, there is a problem that the on-resistance as the semiconductor device increases.

In addition, since the electromotive force is generated by the inductance of the bonding wire, there is a problem that a delay such as a decrease in a rising speed and a falling speed of the semiconductor device, ringing in which a drain current and a source voltage change drastically with time, and the like are likely to occur.

In addition, the potential on the side of the bottom surface of the nitride semiconductor device 30 is generally the same as the source potential of the semiconductor device. On the other hand, the potential on the side of the bottom surface of the MOSFET 80 in the semiconductor device 800, that is, the potential of the metal plate 832 becomes the potential of the drain electrode of the MOSFET 80. Then, since the side of the bottom surface has different potentials depending on locations, there is a problem that measures such as floating a part is required.

Therefore, the semiconductor device 100 according to the present embodiment includes: the first nitride semiconductor layer 10 having the first surface 10*a* and the second surface 10*b*; the first source electrode 14 provided on the first surface 10*a*; the first drain electrode 16 provided on the first surface 10*a*; the first gate electrode 18 provided on the first surface 10*a* between the first source electrode 14 and the first drain electrode 16; the second nitride semiconductor layer 12 having the third surface 12*a* and the fourth surface 12*b*, the third surface 12*b* being provided on the second surface 10*b* and facing the second surface 10*b*, and the second nitride semiconductor layer 12 having a smaller band gap than the first nitride semiconductor layer 10; and the MOSFET 80 having the fifth surface 80*b* provided on the fourth surface 12*b* and facing the fourth surface 12*b* with a size equal to or smaller than a size of the fourth surface 12*b*, and including the first semiconductor material having a smaller band gap than the second nitride semiconductor layer 12.

According to this configuration, since the nitride semiconductor device 30 and the MOSFET 80 are stacked, it is possible to provide a downsized semiconductor device. In particular, since the nitride semiconductor device 30 is required to have a high breakdown voltage, it is preferable to provide a distance between the first source electrode 14, the first drain electrode 16, and the first gate electrode 18 to some extent, so that the size tends to be large. On the other hand, since the MOSFET 80 has a low breakdown voltage, the size becomes small. Furthermore, although the MOSFET 80 is bonded onto the bonding material 34 in the manufacturing process, alignment of the MOSFET 80 on the bonding material 34 is easily performed when the fifth surface 80*b* has a size equal to or smaller than the size of the fourth surface 12*b*. Therefore, the fifth surface 80*b* of the MOSFET 80 has a size equal to or smaller than the size of the fourth surface 12*b* of the nitride semiconductor device 30.

The semiconductor device 100 further includes the first via 24 penetrating the first nitride semiconductor layer 10 and the second nitride semiconductor layer 12 and electrically connected to the first source electrode 14; and the conductive material 32 provided between the fourth surface 12*b* and the fifth surface 80*b* and electrically connected to the first via 24. Therefore, the nitride semiconductor device 30 and the MOSFET 80 are easily stacked.

The MOSFET 80 is preferably a vertical MOSFET. Since the second drain electrode 56 is provided on the back surface, formation of a circuit cascode-connected by stacking is easily performed.

Further, the third via 26 and the second substrate 42 can be easily bonded by using the second conductive layer 44 and the third conductive layer 45.

A material including Au (gold) and Sn (tin) that is preferably used as the third conductive layer 45 can be bonded at a relatively low temperature, so that warpage of the first substrate 40 and the second substrate 42 can be reduced. In addition, the thermal budget applied to the semiconductor device in the manufacturing process can be reduced. In addition, even if a small-scale process change is performed, performance degradation or the like hardly occurs in the semiconductor device to be manufactured.

In order to electrically connect the third via 26 and the third conductive layer 45, it is preferable to form the second conductive layer 44 connected to the third via 26 in advance and then electrically connect the third via 26 and the third conductive layer 45 via the second conductive layer 44 rather than directly electrically connecting the third via 26 and the third conductive layer 45.

According to the semiconductor device of the present embodiment, it is possible to provide a downsized semiconductor device.

Second Embodiment

A semiconductor device 105 of the present embodiment is different from the semiconductor device of the first embodiment in that a first substrate 40 is provided between a fourth surface and a MOSFET 80. Here, description of contents overlapping with those of the first embodiment will be omitted.

Figure 14:
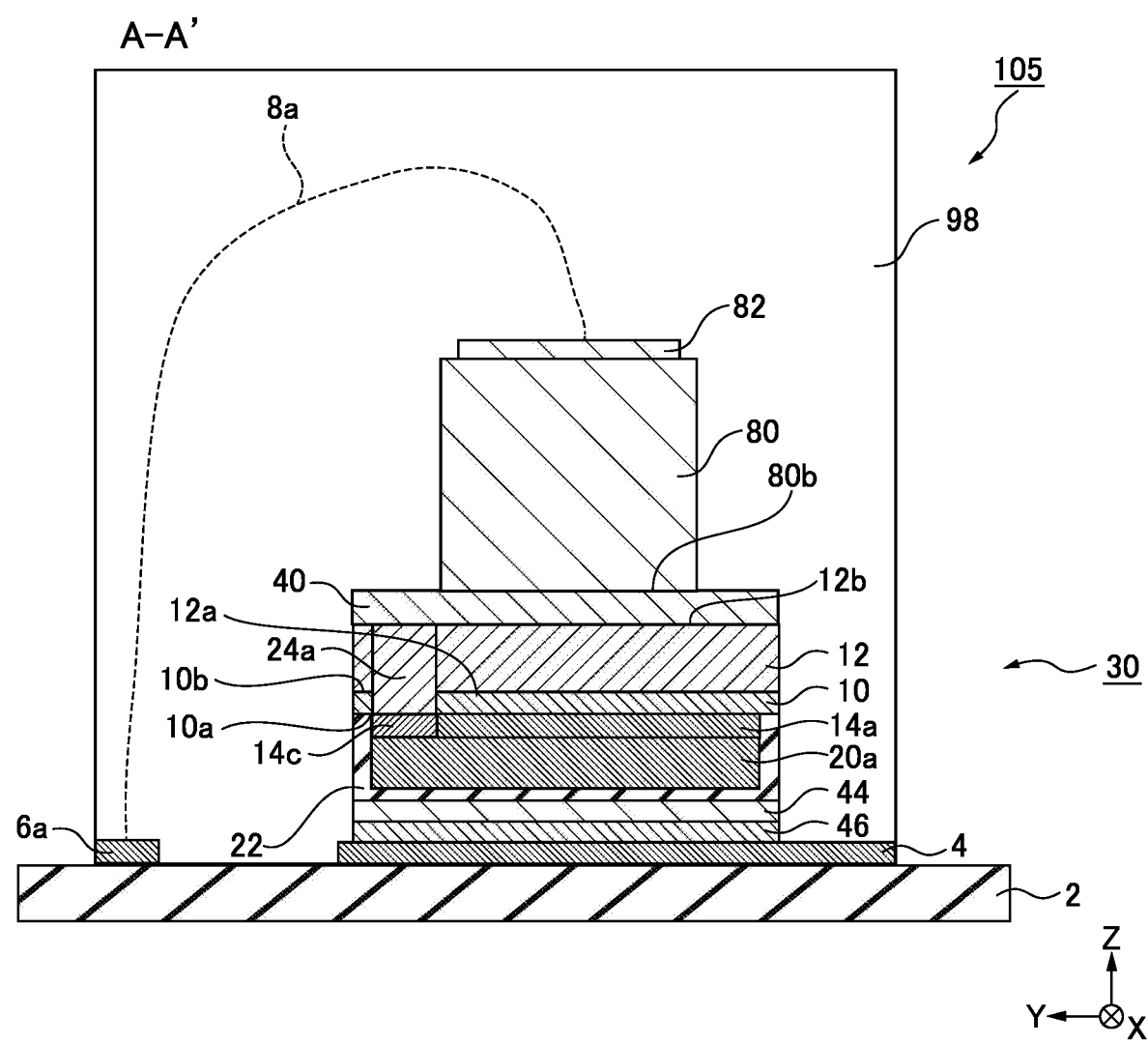
FIG. 14 is a schematic cross-sectional view of a semiconductor device of a second embodiment.

FIG. 14 is a schematic cross-sectional view of the semiconductor device 105 of the second embodiment. The first substrate 40 removed in the manufacturing process in the semiconductor device of the first embodiment is used without being removed. As the first substrate 40, a Si substrate doped with impurities is preferably used because it has electrical conductivity. On the other hand, the semiconductor device 105 does not include a second substrate 42. The semiconductor device 105 also does not include a third conductive layer 45.

FIGS. 15 and 16 are schematic cross-sectional views illustrating manufacturing processes of the semiconductor device 105 of the present embodiment. The processes illustrated in FIGS. 15 and 16 are similar to the processes illustrated in FIGS. 9 and 10. However, after the above processes, the first substrate 40 is not removed. Also, bonding with the second substrate 42 is not performed. The following manufacturing processes are omitted.

According to the semiconductor device of the present embodiment, since the first substrate 40 is not removed and bonding with the second substrate 42 is not performed, the semiconductor device can be easily manufactured. According to the semiconductor device of the present embodiment, it is also possible to provide a downsized semiconductor device.

Third Embodiment

A semiconductor device of the present embodiment is different from the semiconductor devices of the first and second embodiments in that a control circuit (an example of a second semiconductor device) 90 is further provided. Here, description of contents overlapping with those of the first and second embodiments will be omitted.

Figure 17:
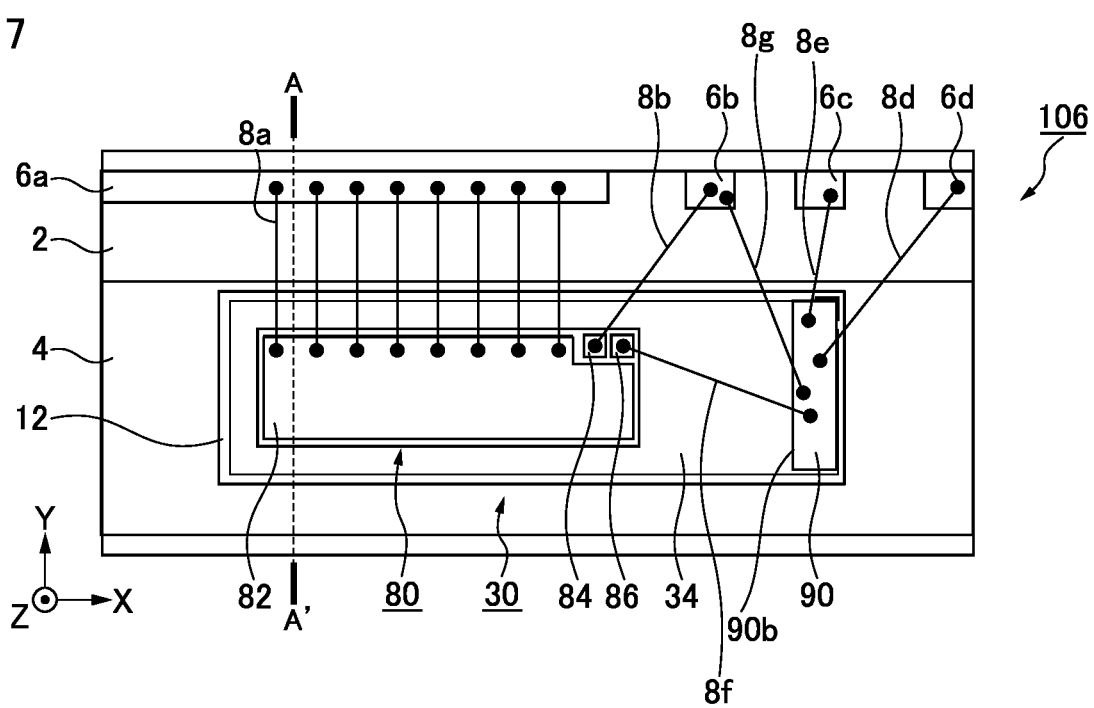
FIG. 17 is a schematic top view of a semiconductor device of a third embodiment.

FIG. 17 is a schematic top view of a semiconductor device 106 of the present embodiment.

The control circuit (an example of the second semiconductor device) 90 is provided, for example, on a bonding material 34 and a first gate pad 33. The control circuit 90 is provided on a fourth surface 12*b* of a second nitride semiconductor layer 12 with a conductive material 32 and a bonding material 34 therebetween. The control circuit 90 has a sixth surface 90*b* facing the fourth surface 12*b* with a size equal to or smaller than a size of the fourth surface 12*b*. The sixth surface 90*b* is a bottom surface of the control circuit 90. The control circuit 90 has a gate drive circuit 196 (FIGS. 7 and 8), and inputs a predetermined control signal to, for example, a first gate electrode 18 and a second gate electrode 70. The control circuit 90 is an IC in which a plurality of elements are integrated into one chip or an electronic circuit board in which a plurality of electronic components are disposed, and includes silicon (Si) (an example of a second semiconductor material) having a smaller band gap than the second nitride semiconductor layer 12.

For example, a gate drive circuit 196, a diode 170, a resistor 175, a capacitor 185, and a diode 180 can be incorporated in the control circuit 90. Note that, for example, a part of the gate drive circuit 196, the diode 170, the resistor 175, the capacitor 185, and the diode 180 can be incorporated, and contents of components incorporated in the control circuit 90 are not particularly limited.

The control circuit 90 is electrically connected to a pad 6*b* by, for example, a bonding wire 8*g*. Further, for example, the control circuit 90 is electrically connected to a pad 6*c* by, for example, a bonding wire 8*e*. Further, for example, the control circuit 90 is electrically connected to a pad 6*d* by, for example, a bonding wire 8*d*. Further, for example, the control circuit 90 is electrically connected to a second gate pad 86 by, for example, a bonding wire 8*f*. For example, the gate signal is input to the control circuit 90 using the pad 6*c* and the pad 6*d*. For example, a nitride semiconductor device 30 and a MOSFET 80 can be controlled using the gate drive circuit 196 incorporated in the control circuit 90.

According to the semiconductor device of the present embodiment, it is also possible to provide a downsized semiconductor device.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer having a first surface and a second surface;
   a first source electrode provided on the first surface;
   a first drain electrode provided on the first surface;
   a first gate electrode provided on the first surface between the first source electrode and the first drain electrode;
   a second nitride semiconductor layer having a third surface and a fourth surface, the third surface being provided on the second surface and facing the second surface, and the second nitride semiconductor layer having a smaller band gap than the first nitride semiconductor layer;
   a first semiconductor device having a fifth surface provided on the fourth surface and facing the fourth surface with a size equal to or smaller than a size of the fourth surface, the first semiconductor device including a first semiconductor material having a smaller band gap than the second nitride semiconductor layer;
   a first via configured to penetrate the first nitride semiconductor layer and the second nitride semiconductor layer, the first via being electrically connected to the first source electrode; and
   a first conductive layer provided between the fourth surface and the fifth surface, the first conductive layer being electrically connected to the first via,
   wherein
   the first semiconductor device includes:
   a second drain electrode electrically connected to the first conductive layer;
   a first semiconductor layer of a first conductivity type provided on the second drain electrode;
   a first semiconductor region of a second conductivity type provided on the first semiconductor layer;
   a second semiconductor region of a first conductivity type provided on the first semiconductor region;
   a second gate electrode provided on the second semiconductor region; and a second source electrode provided on the second semiconductor region.

2. The semiconductor device according to claim 1, further comprising:
a first substrate provided between the fourth surface and the first semiconductor device, the first substrate having electrical conductivity.

3. The semiconductor device according to claim 2, wherein
the first substrate is a silicon (Si) substrate doped with impurities.

4. The semiconductor device according to claim 1, further comprising:
a second substrate provided under the first source electrode, the first drain electrode, and the first gate electrode, the second substrate being electrically connected to the first drain electrode, and the second substrate having electrical conductivity.

5. The semiconductor device according to claim 4, further comprising:
a second conductive layer provided between the second substrate and the first drain electrode;
a third conductive layer provided between the second substrate and the second conductive layer, the third conductive layer being electrically connected to the second substrate and the second conductive layer, and the third conductive layer including Au (gold) and Sn (tin); and
a third via provided between the first drain electrode and the second conductive layer, the third via electrically connecting the first drain electrode and the second conductive layer.

6. The semiconductor device according to claim 1, further comprising:
a second semiconductor device having a sixth surface provided on the fourth surface and facing the fourth surface with a size equal to or smaller than a size of the fourth surface, the second semiconductor device including a second semiconductor material having a smaller band gap than the second nitride semiconductor layer.

7. The semiconductor device according to claim 6, wherein
the second semiconductor device includes a control circuit inputting a predetermined control signal to the first gate electrode.

8. The semiconductor device according to claim 7, wherein
the control circuit includes:
a capacitor having a first end electrically connected to the first gate electrode and a second end;
a diode having an anode and a cathode, the anode being electrically connected to the first gate electrode and the first end, and the cathode being electrically connected to the first source electrode; and
a gate drive circuit electrically connected to the second end.

9. The semiconductor device according to claim 1, further comprising:
a first substrate provided between the fourth surface and the first semiconductor device, the first substrate having electrical conductivity.

10. The semiconductor device according to claim 9, wherein
the first substrate is a silicon (Si) substrate doped with impurities.

11. The semiconductor device according to claim 1, further comprising:
a second substrate provided under the first source electrode, the first drain electrode, and the first gate electrode, the second substrate being electrically connected to the first drain electrode, and the second substrate having electrical conductivity.

12. The semiconductor device according to claim 11, further comprising:
a second conductive layer provided between the second substrate and the first drain electrode;
a third conductive layer provided between the second substrate and the second conductive layer, the third conductive layer being electrically connected to the second substrate and the second conductive layer, and the third conductive layer including Au (gold) and Sn (tin); and
a third via provided between the first drain electrode and the second conductive layer, the third via electrically connecting the first drain electrode and the second conductive layer.

13. The semiconductor device according to claim 1, further comprising:
a second semiconductor device having a sixth surface provided on the fourth surface and facing the fourth surface with a size equal to or smaller than a size of the fourth surface, the second semiconductor device including a second semiconductor material having a smaller band gap than the second nitride semiconductor layer.

14. The semiconductor device according to claim 13, wherein
the second semiconductor device includes a control circuit inputting a predetermined control signal to the first gate electrode.

15. The semiconductor device according to claim 14, wherein
the control circuit includes:
a capacitor having a first end electrically connected to the first gate electrode and a second end;
a diode having an anode and a cathode, the anode being electrically connected to the first gate electrode and the first end, and the cathode being electrically connected to the first source electrode; and
a gate drive circuit electrically connected to the second end.

16. A semiconductor device comprising:
a first nitride semiconductor layer having a first surface and a second surface;
a first source electrode provided on the first surface;
a first drain electrode provided on the first surface;
a first gate electrode provided on the first surface between the first source electrode and the first drain electrode;
a second nitride semiconductor layer having a third surface and a fourth surface, the third surface being provided on the second surface and facing the second surface, and the second nitride semiconductor layer having a smaller band gap than the first nitride semiconductor layer;
a first semiconductor device having a fifth surface provided on the fourth surface and facing the fourth surface with a size equal to or smaller than a size of the fourth surface, the first semiconductor device including a first semiconductor material having a smaller band gap than the second nitride semiconductor layer;
a second substrate provided under the first source electrode, the first drain electrode, and the first gate electrode, the second substrate being electrically connected to the first drain electrode, and the second substrate having electrical conductivity;

a second conductive layer provided between the second substrate and the first drain electrode;

a third conductive layer provided between the second substrate and the second conductive layer, the third conductive layer being electrically connected to the second substrate and the second conductive layer, and the third conductive layer including Au (gold) and Sn (tin); and a third via provided between the first drain electrode and the second conductive layer, the third via electrically connecting the first drain electrode and the second conductive layer.

* * * * *